United States Patent [19]

Ohuchi et al.

[11] Patent Number: 4,719,495

[45] Date of Patent: Jan. 12, 1988

[54] EXPOSURE DEVELOPMENT DEVICE FOR LONG BASE MEMBER

[75] Inventors: Kazuo Ohuchi; Chiharu Miyaake; Yutaka Yamamura, all of Osaka, Japan

[73] Assignee: Nitto Electric Industrial Co., Ltd., Osaka, Japan

[21] Appl. No.: 889,534

[22] Filed: Jul. 25, 1986

[30] Foreign Application Priority Data

Sep. 18, 1985 [JP] Japan .................. 60-206788

[51] Int. Cl.$^4$ ............................................. G03B 27/30
[52] U.S. Cl. .................................................. 355/100
[58] Field of Search ................................. 355/100–103

[56] References Cited

U.S. PATENT DOCUMENTS 3,848,998  11/1974  Yonekura et al. ................ 355/100
4,087,182  5/1978  Aiba et al. ......................... 355/100

Primary Examiner—Richard A. Wintercorn
Attorney, Agent, or Firm—Sughrue, Mion, Zinn, Macpeak, and Seas

[57] ABSTRACT

An exposure development device for long base member is disclosed, comprising:

a long base member exposing section which repeats the operations of exposing an image forming long base member in the long size state, the image forming long base member being prepared by laminating an image forming material comprising a transparent support having adhered thereon a photopolymerizable composition layer on a long substrate on the surface of which an image is formed, and intermittently feeding the exposed image forming long base member;

a synchronous connection section which detects a length of the image forming long base member intermittently fed from the exposing section and continuously feeds the image forming long base member; and a continuous peel development section which continuously peels the transparent support and non-exposed portions of the photopolymerizable composition layer of the image forming long base member continuously fed from the synchronous section, from the long substrate to retain the exposed photopolymerizable composition layer thereon, whereby an image is formed continuously on the long substrate.

2 Claims, 3 Drawing Figures

EXPOSURE DEVELOPMENT DEVICE FOR LONG BASE MEMBER

FIELD OF THE INVENTION

The present invention relates to an exposure development device for a long base member used, for example, in continuous production of a long base member for printed circuits or the like.

BACKGROUND OF THE INVENTION

As shown in FIG. 3, an image forming long base member 1 used for production of printed circuit or the like has the structure comprising a long substrate 2 on the surface of which an image is formed and an image forming material 5 comprising a transparent support 3 having adhered thereon a photopolymerizable composition layer 4, the photopolymerizable composition layer 4 being in contact with the long substrate 2.

Conventionally, the exposure and development methods for such a long base member 1 as described above include the following two methods. One method comprises cutting a long base member into short base members in accordance with the size of original films to be exposed by ultraviolet rays; closely attaching individual one of the original films onto individual one of the short base member and exposing with ultraviolet rays; heating the exposed short base member if necessary; and peeling a transparent support from the short base member to thereby form a resist film having a shape of the image of the original on a substrate of the short base member. Other method comprises closely attaching an original film onto a part of a long base member in its non-cut state; exposing the long base member with ultraviolet rays; repeating the above steps to expose the long base member over its length; cutting the exposed long base member into short base members in accordance with patterns; and peeling a transparent support from each of the short base member to form a resist film having a shape of a desired image on a substrate of the short base member.

The method described above in which a long base member is cut into short pieces to be subjected to exposure development treatment has the problems that the number of working steps are increased, automatic operation is difficult, and defective products are generated in the working steps due to dust, foreign matters, hit marks, or the like, caused in the cutting step.

In order to overcome the above problems due to the short size cutting, an image forming method that after ultraviolet exposure has been conducted on a long base member in the long size state, a transparent support is peeled in the long size state from the long base member to form an image-shaped long resist film is proposed.

In the case where a long base member is exposed and developed in the long size state, however, it is difficult to continuously process the long base member by an exposure device and a development device, because the exposure device operates intermittently while the development device operates continuously. Further, the long base member must be handled one roll by one roll in the case where the long base material is processed in the long size state, resulting in unavoidable loss of production time.

Especially, in the case of an image forming material which is developed using a solvent or an alkali aqueous solution, the image forming material must be allowed to stand until the material is subjected to development after imagewise exposure, so that it is more difficult to conduct the exposure and development processing continuously. Accordingly, an improvement in that a long base member can be exposed and developed continuously has been demanded.

SUMMARY OF THE INVENTION

Accordingly, one object of the present invention is to overcome the problems in the prior art as described above.

Another object of the present invention is to provide an exposure development device for a long base member in which the intermittent feeding condition of a long base member into an exposing section is determined by a computer on the basis of detection of the length of the long base member fed from the exposing section and the intermittent feeding mode is changed into a continuous feeding mode by changing the developing speed to thereby make it possible to continuously conduct the peel development processing to the long base member in the long size state.

The exposure development device for a long base member according to the present invention comprises:

a long base member exposing section which repeats the operations of imagewise exposing an image forming long base member in the long size state, the image forming long base member being prepared by laminating an image forming material comprising a transparent support having adhered thereon a photopolymerizable composition layer on a long substrate on the surface of which an image is formed, and intermittently feeding the exposed image forming long base member;

a synchronous connection section which detects a length of the image forming long base member intermittently fed from the exposing section and continuously feeds the image forming long base member; and a continuous peel development section which continuously peels the transparent support and non-exposed portions of the photopolymerizable composition layer of the image forming long base member continuously fed from the synchronous section, from the long substrate to retain the exposed photopolymerizable composition layer thereon, whereby an image is formed continuously on the long substrate.

Thus, according to the present invention, an image forming long base member is subjected to imagewise exposure in the long size state in an exposing section, the length of the long base member intermittently fed from the exposing section is detected to change from the intermittent feeding mode to a continuous feeding mode in a synchronous connection section, and a transparent support on the base member immediately after exposure is peeled from the long substrate while adjusting the feeding speed, whereby a resist film having image patterns is formed on the long substrate.

DETAILED DESCRIPTION OF THE INVENTION

The embodiment of the present invention will be explained by reference to the accompanying drawings.

Figure 1:
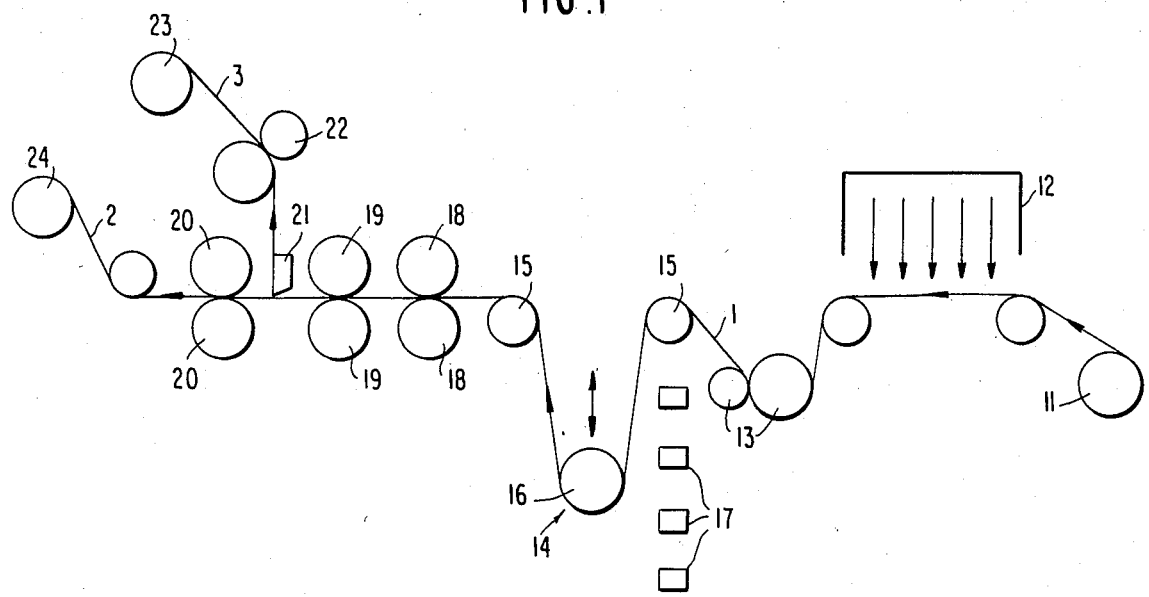
FIG. 1 is a schematic view showing an exposure development device according to the present invention.

In FIG. 1, an image forming long base member 1 comprising a substrate 2 having adhered thereon an image forming material 5 is rolled, supported by a feed part 11, drawn into an ultraviolet exposing section 12, and imagewise exposed.

The long base member 1 after exposure is fed intermittently in accordance with an exposed size determined by pinch rollers 13 disposed in the next stage. The long base member 1 is then led into a synchronous connection section 14 disposed in the forward stage so that the feeding mode of the long base member 1 is changed from an intermittent mode to a continuous mode.

The synchronous connection section 14 is composed of a pair of rollers 15 and 15 for supporting the long base material 1, an upwardly and downwardly movable roller 16 disposed between the rollers 15 and 15, and a plurality of detectors 17 vertically arranged beside the movable roller 16 so as to detect the vertical position of the movable roller 16. Thus, the detectors 17 detect the vertical level of the movable roller 16 to determine the length of the long base member 1 transported from the exposing section 12.

The long base member 1 passed through the synchronous connection section 14 is passed through between heating rollers 18 and heated thereby, and predetermined tension is given by pinch rollers 19 before development and pinch rollers 20 after development. Between the pinch rollers 19 before development and the pinch rollers 20 after development, the transparent support 3 is continuously peeled together with non-exposed portions of the photopolymerizable composition layer 4 from the long substrate 2 by pinch rollers 22 for taking-up the transparent support 3 along a peeling bar 21 disposed between the pinch rollers 19 before development and the pinch rollers 20 after development, and the exposed portions of the photopolymerizable composition layer 4 is retained on the substrate 2. The transparent support 3 with the non-exposed portions of the photopolymerizable composition layer 4 is taken up by a support takeup roller 23 and the long substrate 2 formed with a pattern is taken up by a substrate take-up roller 24.

Figure 2:
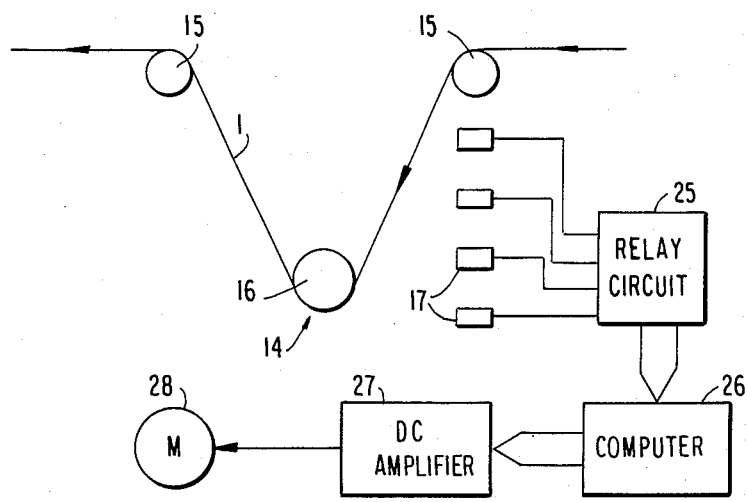
FIG. 2 is an enlarged view of a main portion of the device.
Figure 3:
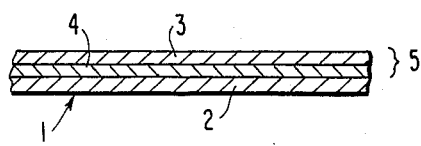
FIG. 3 is a cross-section of a portion of a long base member.

The vertical position of the movable roller 16 disposed between the base member supporting rollers 15 and 15 is detected by the detectors 17 in the synchronous connection section 14 described above, and the thus obtained information is supplied to a computer 26 through a relay circuit 25 as shown in FIG. 2. The computer 26 determines the vertical position of the movable roller 16 so as to generate a control signal which is in turn transferred to a DC motor 28 for driving the rollers in the removing and developing section through a DC amplifier 27.

The control is performed by the computer 26 so as to make the control signal supplied to the DC motor larger to accelerate the DC motor when the movable roller 16 is located at a lower position in the synchronous connection section 14, and make the control signal smaller to decelerate the DC motor when the movable roller 16 is located at a higher position in the synchronous connection section 14. On the other hand, the current motor speed is maintained when the movable roller 16 is located at a middle position in the synchronous connection section 14. Thus, the feeding state of the long base member 1 is changed from the intermittent feeding mode into the continuous feeding mode in this synchronous connection section.

The present invention is explained in greater detail by reference to the following examples.

EXAMPLE 1

In FIGS. 1 and 2, exposure was conducted in the exposing section by employing a so-called off-contact method in which an original mask was urged to closely contact with an image forming material and irradiated with collimated ultraviolet rays. Imagewise exposure was conducted on an area of 500 mm×500 mm of the image forming material and the image forming material was fed forward by 500 mm every exposure cycle.

In the synchronous connection section, four detectors were used to detect the vertical position of the movable roller. In this case, the computer controlled the DC motor to accelerate it by 0.02 m/min. when the detector disposed at the lowermost position detected the movable roller in every cycle of processing of the computer, and decelerate the motor by 0.02 m/min. when the two intermediately disposed detectors detected the movable roller in every processing cycle.

Thus, the feeding condition of the long base member was changed from the intermittent mode into the continuous mode. The base member was heated up to about 36° C. by the heating rollers and the transparent support was peeled along the peeling bar. Thus, patterns were formed continuously.

In this example, the speed of the long base member continuously fed in the peel development section was 0.8 to 1.0 m/min.

EXAMPLE 2

In FIGS. 1 and 2, imagewise exposure was conducted on the area of 500 mm×500 mm of the image forming material by the same processing as the Example 1, and fed forward by 250 mm every exposure processing cycle, and the cycle was repeated. In this example, the continuous feeding speed at the peel development section was 0.48 to 0.5 m/min.

Further, in each example described above, the unit value of variation in speed was small and effect due to the variation in speed was not substantially recognized in forming images.

According to the present invention, as described above, an intermittent feeding mode of a long base member in an exposing section is automatically converted into a continuous feeding mode by means of detectors and a computer to continuously feed the long base member, so that the two steps of exposure and development can be conducted continuously and a full automatic operator-less operation can be conducted only by setting a long base member, resulting in reduction of production time as well as in extreme reduction of the number of the working steps.

Further, the exposure and the development can be continuously conducted onto a long base member in the long size state, so that it is possible to protect the base member from dust or hit marks to thereby reduce the occurrence of defective products in the steps of processing.

While the invention has been described in detail and with reference to specific embodiments thereof, it will be apparent to one skilled in the art that various changes and modifications can be made therein without departing from the spirit and scope thereof.

What is claimed is:

1. An exposure and development device comprising intermittent feed means for intermittently feeding a continuous laminate comprised of a substrate and image forming material to light exposing means, synchronous connecting means for intermittently receiving said laminate from said exposing means and converting the intermittent feeding of the laminate to continuous feeding and peel development means receiving said laminate from said synchronous connecting means for continuously peeling said image forming means from said substrate.

2. An exposure and development device as set forth in claim 1 wherein said synchronous connecting means is comprised of intermittently operated feed roller means for intermittently feeding said laminate, continuously operated feed roller means for continuously feeding said laminate, a pair of spaced apart support rollers supporting said laminate between said intermittently operated feed roller means and said continuously operated feed roller means, moveable roller means engaging said laminate between said pair of rollers and moveable transversely relative to the path of said laminate for forming an adjustable length loop in said laminate, detecting means for detecting the position of said moveable roller means and control means connected to said detecting means for controlling the speed of rotation of said continuously operated feed roller means.

* * * * *